(12) United States Patent
Lee et al.

(10) Patent No.: US 11,340,640 B2
(45) Date of Patent: May 24, 2022

(54) DRIVER CIRCUIT

(71) Applicant: Yu-Lin Lee, New Taipei (TW)

(72) Inventors: Yu-Lin Lee, New Taipei (TW);
Kuo-Chung Huang, New Taipei (TW)

(73) Assignee: Yu-Lin Lee, New Taipei (TW)

( * ) Notice: Subject to any disclaimer, the term of this patent is extended or adjusted under 35 U.S.C. 154(b) by 0 days.

(21) Appl. No.: 16/400,075

(22) Filed: May 1, 2019

(65) Prior Publication Data
US 2019/0342980 A1 Nov. 7, 2019

(30) Foreign Application Priority Data

May 3, 2018 (TW) ................................ 107115079

(51) Int. Cl.
*G05F 1/56* (2006.01)
*H03K 23/54* (2006.01)
(Continued)

(52) U.S. Cl.
CPC ............. *G05F 1/56* (2013.01); *H03K 23/542* (2013.01); *H05B 45/10* (2020.01); *H05B 47/175* (2020.01);
(Continued)

(58) Field of Classification Search
CPC .......... H05B 47/19; G05F 1/56; H03K 23/542
See application file for complete search history.

(56) References Cited

U.S. PATENT DOCUMENTS 3,833,005 A * 9/1974 Wingrove .......... A61N 1/37211
607/31
3,911,254 A * 10/1975 Leibrecht ............... G03B 17/24
377/8
(Continued)

FOREIGN PATENT DOCUMENTS

CN        1087034         5/1994
CN      101197108         6/2008
(Continued)

OTHER PUBLICATIONS

Machine Translation of JPH01-107496A.*
(Continued)

*Primary Examiner* — Alexander H Taningco
*Assistant Examiner* — Pedro C Fernandez
(74) *Attorney, Agent, or Firm* — Demian K. Jackson; Jackson IPG PLLC

(57) ABSTRACT

The driver circuit according to the invention includes a receiver module, a counter unit, isolation units and a voltage regulation unit. The receiver module receives an initiation signal and performs filtering using a low-pass filter to convert the initiation signal into a driving signal which is transmitted to the counter unit. Upon receiving the driving signal, the output terminals of the counter unit are sequentially activated to output a control signal. The isolation units may be diodes or transistors adapted to output an isolated control signal. The voltage regulation unit includes a plurality of resistors and is adapted to output a control voltage corresponding to one of the resistors according to the isolated control signal. The control voltage is useful in shifting the operation of an electrical device from one operation state to another.

14 Claims, 6 Drawing Sheets

(51) Int. Cl.
  *H05B 47/195* (2020.01)
  *H05B 47/175* (2020.01)
  *H05B 47/185* (2020.01)
  *H05B 45/10* (2020.01)

(52) U.S. Cl.
  CPC ......... *H05B 47/185* (2020.01); *H05B 47/195* (2020.01)

(56) References Cited

U.S. PATENT DOCUMENTS

| | | | |
|---|---|---|---|
| 4,045,777 A | | 8/1977 | Mierzwinski et al. |
| 4,151,481 A | * | 4/1979 | Funston ................. H03G 3/001 |
| | | | 330/129 |
| 4,901,003 A | * | 2/1990 | Clegg .................... G01R 31/60 |
| | | | 324/66 |
| 5,450,068 A | | 9/1995 | Steffen |
| 5,459,489 A | | 10/1995 | Redford |
| 5,839,816 A | | 11/1998 | Varga et al. |
| 6,107,981 A | | 8/2000 | Fujita |
| 6,160,490 A | * | 12/2000 | Pace .................... H02J 7/0031 |
| | | | 340/7.37 |
| 6,597,598 B1 | * | 7/2003 | Tran ....................... G11C 16/28 |
| | | | 365/94 |
| 7,268,830 B2 | | 9/2007 | Lee |
| 8,110,997 B2 | | 2/2012 | Muramatsu |
| 2006/0139451 A1 | * | 6/2006 | Yoneno ............ H04N 21/44231 |
| | | | 348/114 |
| 2007/0096563 A1 | * | 5/2007 | Atluri ..................... H02J 9/061 |
| | | | 307/65 |
| 2008/0292344 A1 | | 11/2008 | Nagumo |
| 2009/0322255 A1 | * | 12/2009 | Lin ....................... H05B 47/185 |
| | | | 315/307 |
| 2010/0079081 A1 | | 4/2010 | Zhang et al. |
| 2010/0308749 A1 | | 12/2010 | Liu |
| 2011/0012536 A1 | | 1/2011 | Lin et al. |
| 2011/0050110 A1 | | 3/2011 | Han |
| 2011/0109249 A1 | | 5/2011 | Liu et al. |
| 2011/0128303 A1 | | 6/2011 | Yonemaru et al. |
| 2012/0119674 A1 | | 5/2012 | Lee et al. |
| 2012/0306826 A1 | | 12/2012 | Tsuchi |
| 2016/0119995 A1 | | 4/2016 | Han |

FOREIGN PATENT DOCUMENTS

| | | |
|---|---|---|
| CN | 101621878 | 1/2010 |
| CN | 101621878 A | 1/2010 |
| CN | 102052592 A | 5/2011 |
| CN | 102173281 A | 9/2011 |
| CN | 201986225 | 9/2011 |
| CN | 102333400 | 1/2012 |
| CN | 103066850 A | 4/2013 |
| CN | 103152905 | 6/2013 |
| CN | 204119627 | 1/2015 |
| CN | 105050265 A | 11/2015 |
| CN | 105826898 | 8/2016 |
| CN | 103428962 | 10/2016 |
| CN | 106612577 | 5/2017 |
| CN | 108966407 A | 12/2018 |
| DE | 39 91 599 | 9/1990 |
| EP | 2498579 A2 | 12/2012 |
| GB | 2 193 939 | 2/1988 |
| JP | H01-107496 A * | 4/1989 |
| JP | 1-160146 | 6/1989 |
| JP | H03-1487 | 1/1991 |
| JP | H06-203968 | 7/1994 |
| JP | 2005284691 A | 10/2005 |
| JP | 2006054280 | 2/2006 |
| JP | 2006-166189 | 6/2006 |
| JP | 3135483 U | 9/2007 |
| JP | 135138 A | 6/2009 |
| JP | 015728 A | 1/2010 |
| JP | 2013-164932 | 8/2013 |
| KR | 100625705 | 9/2006 |
| KR | 0101355 | 9/2010 |
| KR | 0095340 | 8/2016 |
| TW | M393951 | 12/2010 |
| TW | 201218862 | 5/2012 |
| TW | I387396 | 2/2013 |
| TW | I628975 | 7/2018 |

OTHER PUBLICATIONS

Taiwan Search Report for Application No. 106117768.
International Search Report for Application No. PCT/CN2017/086272.
Taiwan Search Report for Application No. 107115079.
Japanese Office Action for Application No. 2018-098540.
U.S. Office Action for U.S. Appl. No. 15/988,536.
Taiwan Office Action for application No. 108112752 dated Mar. 3, 2018.
Japanese Office Action for Application No. JP2019-531889 dated Jun. 2, 2020.
Korean Office Action for Application No. KR10-2019-0050390 dated May 27, 2020.
Singapore Office Action for Application No. 11201909492W dated Apr. 23, 2020.
European Search Report for Application No. EP19172310.5 dated Sep. 10, 2019.
European Search Report for Application No. EP17911682.7 dated Jul. 13, 2020.
Japanese Office Action for Application No. JP2019-079973 dated Jul. 14, 2020.
Korean Office Action for Application No. KR10-2019-7012768 dated May 21, 2020.
HS0201-0001-CN-1 1stOA_SR dated Oct. 14, 2020.
HS0201-0001-US-1 1stOA dated Apr. 2, 2021.
HS0201-0009-CN-1 1stOA dated Jun. 3, 2021.
HS0201-0009-IN-1 1stOA dated Dec. 4, 2020.

* cited by examiner

DRIVER CIRCUIT

PRIORITY CLAIM

This application claims priority to R.O.C. Patent Application No. 107115079 filed May 3, 2018, the entirety of which is incorporated herein by reference.

BACKGROUND OF THE INVENTION

1. Field of the Invention

The present invention relates to a driver circuit, in which a simple circuit architecture is used to output a control voltage following the counting sequence of a counter unit, thereby shifting the operation of an electrical device from one operation state to another.

2. Description of Related Art

Remote controls are necessities of modern life. With remote control, one can conduct various operations of electrical devices such as televisions remotely. Since different electrical devices require corresponding remote controllers, we end up with many remote controllers. It is logical that complicated devices require complicated coding schemes as well as dedicated remote controllers, however, for something as mundane as dimming the light bulb, a simple and generic solution is in demand.

For typical remote control techniques including infrared, radio or Bluetooth technology, transmitter and the receiver need to be paired with each other, that is, the receiver will only respond to the remote control signal from the transmitter that is paired with.

The conventional remote control also requires a decoding scheme or a demodulation function, which can decode or demodulate the received remote control signal to form a corresponding response, which may involve a programmed control unit for establishing the required action program and executing the program based upon the received remote control signal. Therefore, the overall circuit design is complicated.

SUMMARY OF THE INVENTION

According to the invention, a primary object is to provide a driver circuit, where a simple circuit architecture is used to output a control voltage following the counting sequence of a counter unit, thereby shifting the operation of an electrical device from one operation state to another.

In the first aspect provided herein is a driver circuit comprises a receiver module, a counter unit, a plurality of diodes, and a voltage regulation unit. The receiver module comprises a receiver unit and a low-pass filter, wherein the receiver unit is adapted for receiving an initiation signal, and the low-pass filter is adapted for filtering the initiation signal to generate a driving signal. The counter unit has an input terminal and a plurality of output terminals, and is adapted to receive the driving signal via the input terminal and sequentially activate the output terminals following a predetermined counting sequence, thereby outputting a control signal. The diodes are each connected to one of the output terminals of the counter unit. The voltage regulation unit comprises a plurality of first resistors connected to the diodes, respectively, and a second resistor connected in series with the first resistors, so that a control voltage for driving the electrical device is output from the first resistor connected to the activated output terminal and the second resistor according to the control signal.

In the second aspect provided herein is a driver circuit comprises a receiver module, a counter unit, a plurality of transistors, and a voltage regulation unit. The receiver module comprises a receiver unit and a low-pass filter, wherein the receiver unit is adapted for receiving an initiation signal, and the low-pass filter is adapted for filtering the initiation signal to generate a driving signal. The counter unit has an input terminal and a plurality of output terminals, and is adapted to receive the driving signal via the input terminal and sequentially activate the output terminals following a predetermined counting sequence, thereby outputting a control signal. The transistors are each connected to one of the output terminals of the counter unit. The voltage regulation unit comprises a plurality of first resistors connected to the transistors, respectively, and a second resistor connected in series with the first resistors, so that a control voltage for driving the electrical device is output from the first resistor connected to the activated output terminal and the second resistor according to the control signal.

The invention mainly involves utilization of a simple circuit architecture to develop a driver circuit that is adapted to output a control voltage following a predetermined counting sequence, such that the electrical device receiving the control voltage is driven to shift its operation state from one state to another. For instance, the driver circuit disclosed herein is useful in driving a light source module of a lighting device, and different levels of control voltages are responsible for placing the light source module at corresponding operation states (such as ON and OFF, brightness, and color temperature, etc.). Alternatively, the driver circuit disclosed herein is useful in regulating the operational state of a motor (such as its rpm).

According to the preferred embodiments, each of the transistors has a drain terminal connected to one of the output terminals of the counter unit, a gate terminal short-circuit connected to the drain terminal, and a source terminal connected to one of the first resistors.

According to the preferred embodiments, each of the transistors has a gate terminal connected to one of the output terminals of the counter unit, a source terminal connected to one of the first resistors, and a drain terminal connected to a power supply.

According to the preferred embodiments, the receiver unit is adapted to receive a wireless initiation signal. The wireless initiation signal is filtered by the low-pass filter, based on a specific frequency range, to generate a driving signal which is then transmitted to the counter unit. The low-pass filter 22 is adapted to filter out the high-frequency components of the infrared signal and allow the low-frequency components to pass. The driving signal generated after filtering is transmitted to the counter unit, allowing the output terminals of the counter unit to be sequentially activated to output a control signal following the predetermined counting sequence. By using the driver circuit disclosed herein, a broad variety of remote control units may be used to dim the brightness of light emitted from a lighting device without pairing the remote control units with the lighting device, and no decoding or demodulation processing is required. That is to say, a user may simply press any key on a remote control unit to achieve the purpose of controlling the operation of the lighting device.

According to the preferred embodiments, the receiver unit is adapted to receive an initiation signal through a wired connection.

According to the preferred embodiments, the receiver unit comprises a voltage divider circuit.

According to the preferred embodiments, the receiver unit comprises at least two third resistors connected in series, and the low-pass filter is connected at a voltage dividing point between the third resistors.

According to the preferred embodiments, the counter unit is selected from the group consisting of a ring counter and a Johnson counter.

DETAILED DESCRIPTION OF THE INVENTION

The above and other objects, features and effects of the invention will become apparent with reference to the following description of the preferred embodiments taken in conjunction with the accompanying drawings.

Figure 1:
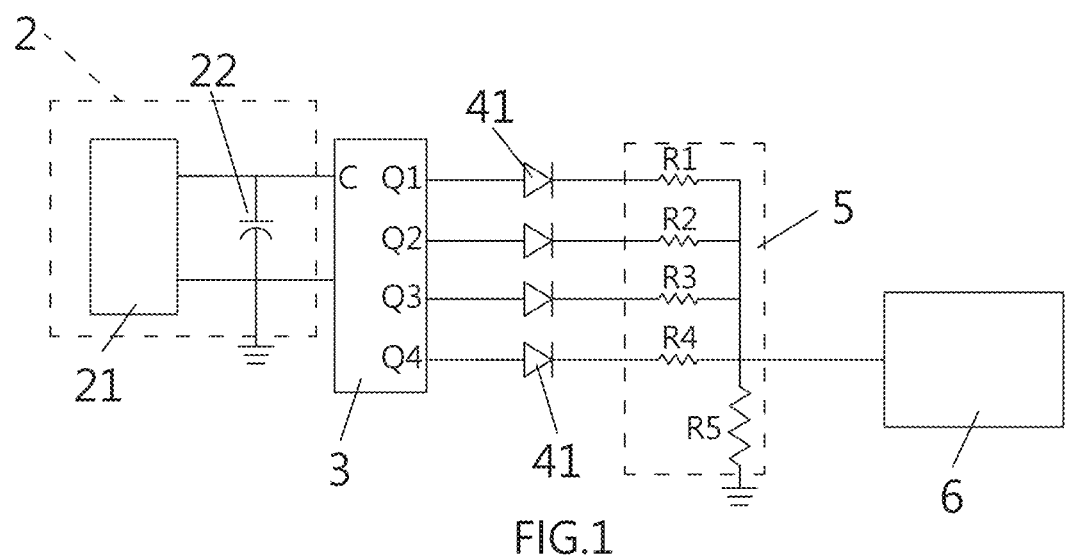
FIG. 1 is a schematic diagram showing the circuit of the driver circuit according to the first embodiment of the invention.

FIG. 1 is a schematic diagram showing the circuit of the driver circuit according to the first embodiment of the invention. The driver circuit disclosed herein comprises a receiver module 2, a counter unit 3, a plurality of isolation units, and a voltage regulation unit 5.

The receiver module 2 includes a receiver unit 21 and a low-pass filter 22. The receiver unit 21 is configured to receive an initiation signal, and the low-pass filter 22 is configured to filter the initiation signal based on a specific frequency range to generate a driving signal. The low-pass filter 22 may be a capacitor adapted to filter out the high-frequency components of the initiation signal and allow the low-frequency components to pass.

The counter unit 3 includes an input terminal C and a plurality of output terminals Q1, Q2, Q3, and Q4. The driving signal described above is received by the input terminal C. Responsive to receiving the driving signal, the counter unit 3 sequentially activates the output terminals Q1, Q2, Q3, and Q4, one at a time, following a predetermined counting sequence, thereby outputting a control signal. The counter unit 3 may be a ring counting device selected from the group consisting of a ring counter and a Johnson counter and is adapted to sequentially output control signals from the output terminals Q1, Q2, Q3, and Q4 according to the received driving signal. It is known in the art that the number of output terminals is not limited to that described herein, and additional counter unit(s) may be included in the device. A plurality of counter units can be connected in series to constitute more output terminals.

According to the first embodiment disclosed herein, the isolation units may be diodes 41 connected to the output terminals Q1, Q2, Q3, Q4 of the counter unit 3, respectively.

The voltage regulation unit 5 includes a plurality of first resistors R1-R4 connected to the diodes 41, respectively, and a second resistor R5 connected in series with the first resistors R1-R4. The first resistors R1-R4 connected in series to the diodes 41 are connected in parallel with each other and connected in series with one end of the second resistor R5. The other end of the second resistor R5 is grounded, allowing the first resistors R1-R4 and the second resistor R5 to generate different levels of control voltages.

Upon receipt of a driving signal via the input terminal C, the counter unit 3 sequentially activates the output terminals Q1, Q2, Q3, and Q4, one at a time, following the predetermined counting sequence, thereby outputting a control signal. The control signal output from the activated one of the output terminals Q1, Q2, Q3, Q4 is transmitted to the diode 41 coupled to the activated output terminal. At the time, because of their unidirectional conductivity, the diodes 41 not receiving the control signal are reverse-biased, while the diode 41 receiving the control signal outputs an isolated control signal, which is then transmitted to the first resistor connected to the diode 41 receiving the control signal. As there is no electric current flowing through the diodes 41 not receiving the control signal, the control signal transmitted to the conducted first resistor is isolated and un-interfered. Afterwards, the conducted first resistor and the second resistor output a corresponding control voltage for driving an electrical device. By way of an example, a lighting device 6 is driven in this embodiment.

Figure 2:
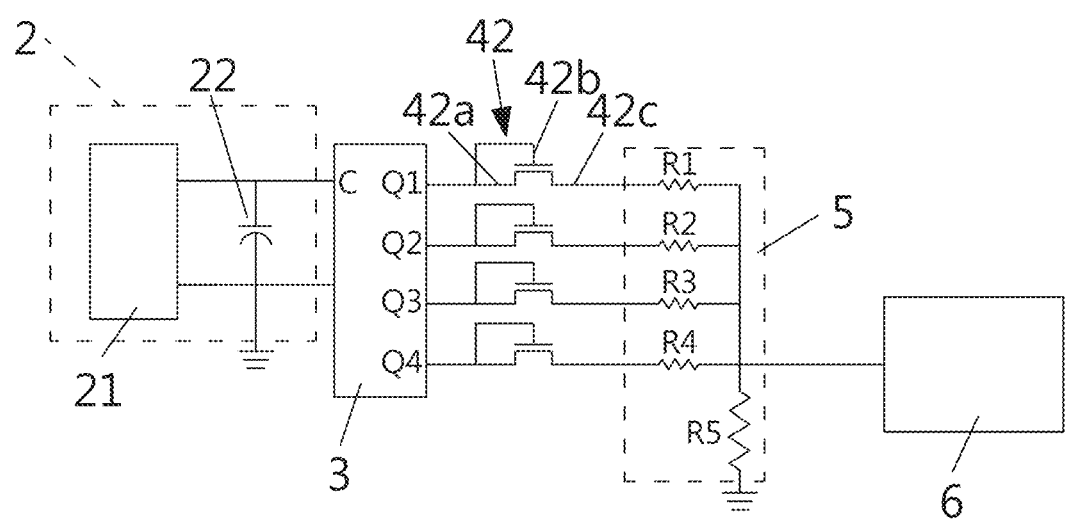
FIG. 2 is a schematic diagram showing the circuit of the driver circuit according to the second embodiment of the invention.

FIG. 2 is a schematic diagram showing the circuit of the driver circuit according to the second embodiment of the invention, which shows that the driver circuit disclosed herein comprises a receiver module 2, a counter unit 3, a plurality of isolation units and a voltage regulation unit 5. The second embodiment differs from the first embodiment above in that a plurality of transistors 42, instead of diodes, are coupled between the counter unit 3 and the voltage regulation unit 5. The transistors 42 are connected to the output terminals Q1, Q2, Q3, Q4 of the counter unit 3, respectively, and adapted to receive the control signal and output an isolated control signal. The voltage regulation unit 5 is configured to include a plurality of first resistors R1-R4 connected to the transistors, respectively, and a second resistor R5.

In some embodiments, as shown in FIG. 2, each of the transistors 42 includes a drain terminal 42a, a gate terminal 42b and a source terminal 42c. The drain terminal 42a is connected to one of the output terminals Q1, Q2, Q3, Q4 of the counter unit 3 and short-circuit connected to the gate terminal 42b, whereas the source terminal 42c is connected to one of the first resistors R1-R4. The transistors 42 may be of any transistor types known in the art, such as bipolar transistors (BJT) and field effect transistors (FET). In the embodiment shown in FIG. 2, N-type MOSFETs are illustrated by way of an example.

Figure 3:
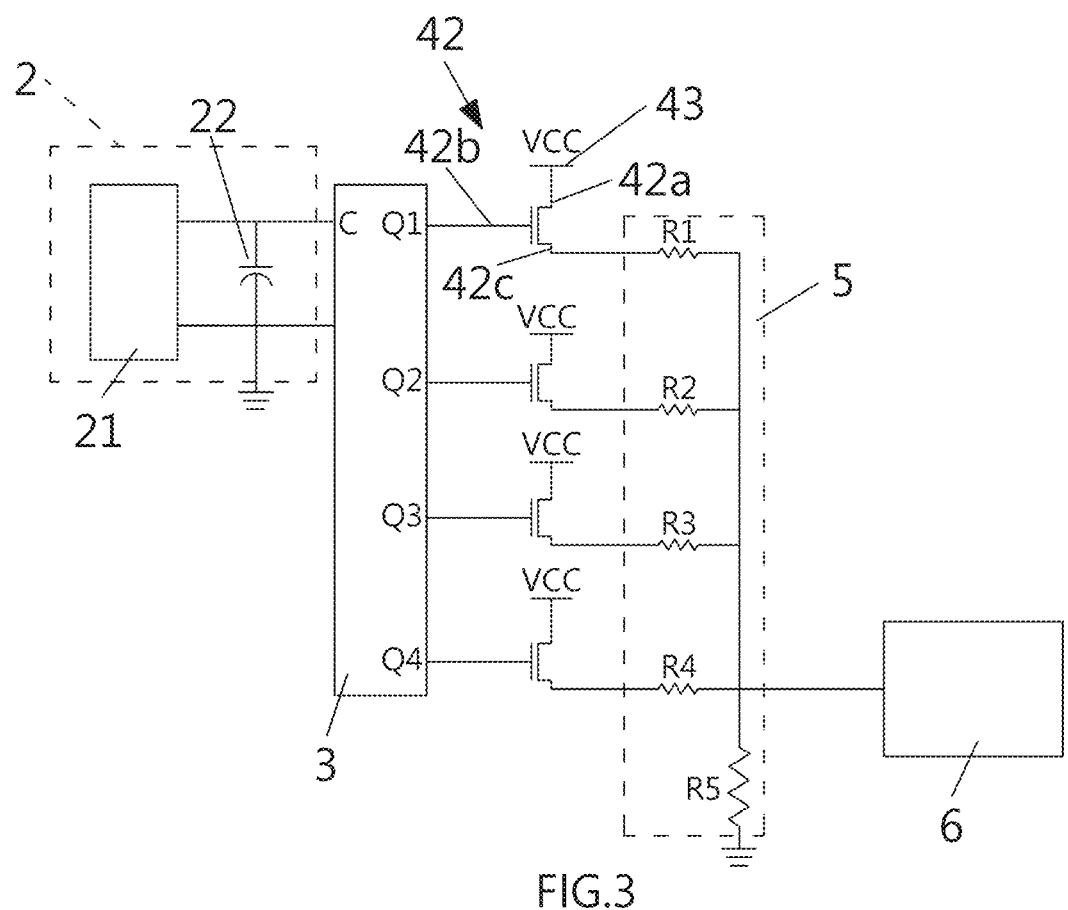
FIG. 3 is a schematic diagram showing the circuit of the driver circuit according to the third embodiment of the invention.

In alternative embodiments shown in FIG. 3, each of the transistors 42 includes a drain terminal 42a, a gate terminal 42b and a source terminal 42c. The gate terminal 42b is connected to one of the output terminals Q1, Q2, Q3, Q4 of the counter unit, the source terminal 42c is connected to one of the first resistors R1-R4, and the drain terminal 42a is connected to a power supply 43.

In use, the driver circuit according to the invention may be controlled in a wired or wireless manner. For example, according to the embodiment shown in FIG. 4, the receiver unit 21 is connected to a switch 81 through a wired connection. By switching the switch 81, an initiation signal is generated. The receiver unit 21 receives the initiation signal through a wired connection and, after the initiation signal is filtered by the low-pass filter 22, a driving signal S1 is generated and transmitted to the counter unit 3. The driving signal S1 is received by the input terminal C of the counter unit 3. Responsive to receiving the driving signal, the counter unit 3 sequentially activates the output terminals Q1, Q2, Q3, and Q4, one at a time, following a predetermined counting sequence, thereby outputting a control signal. For instance, when the switch 81 is pressed once, the driving signal thus generated activates the output terminal Q1 of the counter unit 3 to output a control signal. Alternatively, when the switch 81 is successively pressed twice, the driving signal thus generated activates the output terminal Q2 to output a control signal. In the case where the switch 81 is pressed once, the driving signal thus generated activates the output terminal Q1 to output a control signal S1, which is then transmitted to the transistor 42 connected to the output terminal Q1. Afterwards, the isolated control signal S2 is transmitted to the first resistor connected to the transistor 42. By virtue of the conducted first resistor R1 and second resistor R5, a corresponding control voltage V1 is generated and output to drive the lighting device 6. The driver circuit according to the invention can perform to shift the operation of an electrical device from one state to another based on user's demands, without conducting any decoding or demodulation process.

Figure 4:
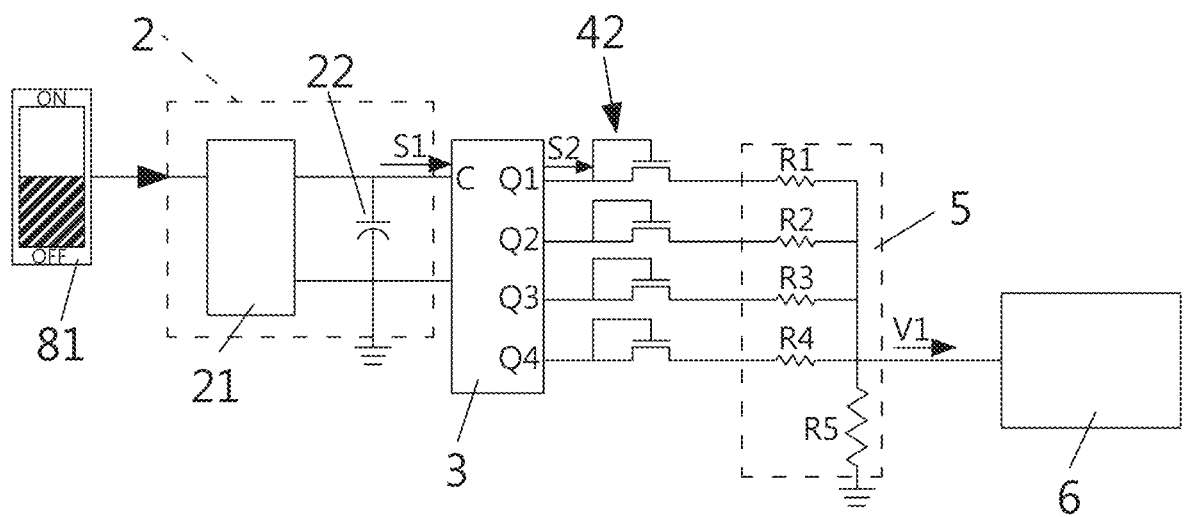
FIG. 4 is a schematic diagram showing the operation of the driver circuit according to the invention.
Figure 5:
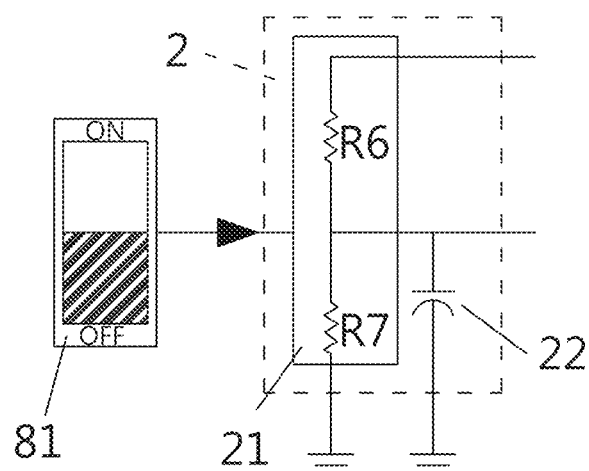
FIG. 5 is a schematic diagram showing the circuit of the receiver unit according to the invention.

In the embodiment shown in FIG. 4, the receiver unit 21 may by way of example be a voltage divider circuit. Further referring to FIG. 5, the receiver unit 21 is configured to include at least two third resistors R6, R7 connected in series, and the low-pass filter 22 is connected at a voltage dividing point between the third resistors R6, R7, so that the initiation signal from the switch 81 is converted by the third resistors R6, R7 to have a suitable voltage level for driving the counter unit. The third resistors R6, R7 have different resistance values. In one preferred embodiment, the resistance of the third resistor R6 is larger than that of the third resistor R7.

Figure 6:
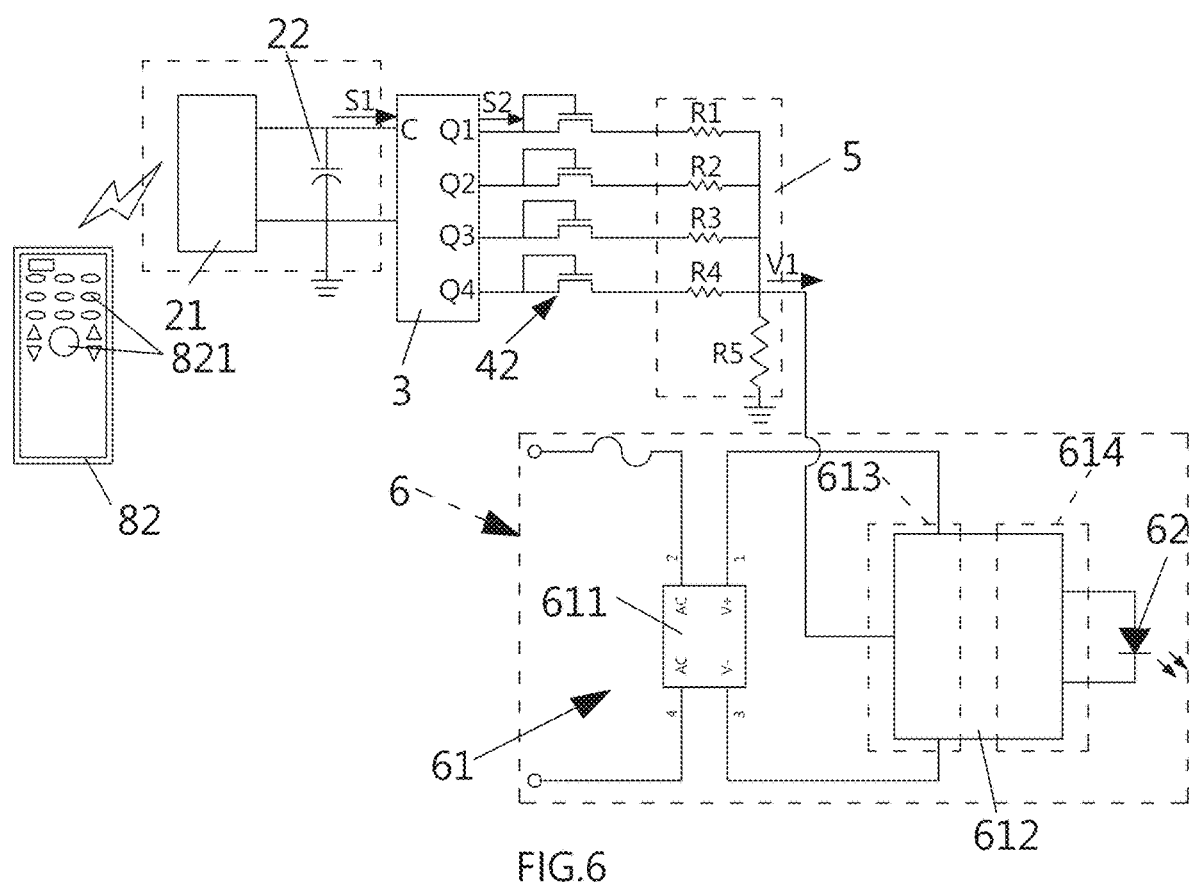
FIG. 6 is another schematic diagram showing the operation of the driver circuit according to the invention.

In the embodiment above, the driver circuit according to the invention is, by way of example, used to drive a lighting device 6. The operation of the invention is illustrated in FIG. 6, taking the fourth embodiment as an example. The lighting device 6 includes a driving unit 61 and at least one light emitting diode 62. The driving unit 61 includes a rectifier circuit 611 and a switching power supply 612. The rectifier circuit 611 is adapted for connection to an AC power source and for converting the AC power source into a DC power source. The switching power supply 612 has a primary side 613 and a secondary side 614. The primary side 613 is connected with the rectifier circuit 611 and the voltage regulation unit 5, and is connected in parallel with the voltage regulation unit 5.

The driver circuit according to the invention may also be controlled in a wireless manner and collaborated with a remote control unit 82, as shown in FIG. 6. The remote control unit 82 is adapted to function using the infrared transmission technology, which may by way of example be any appliance remote controller commonly used at home. A user may press a key 821 on the remote control unit 82 to send out a wireless initiation signal. The wireless transmission of the wireless initiation signal is based on a transmission protocol which may vary from one remote controller to another, and pressing different keys 821 will send out different coded signals. The driver circuit receives the initiation signal via the receiver unit 21 in a wireless manner After filtering by the low-pass filter 22, the driving signal S1 is generated and transmitted to the counter unit 3.

The driving signal S1 is received by the input terminal C of the counter unit 3, and the output terminals Q1, Q2, Q3 and Q4 are sequentially activated to output control signals following the predetermined counting sequence. For example, the driving signal generated by pressing a key 821 once activates the output terminal Q1 to output a control signal, whereas the driving signal generated by successively pressing the key 821 twice activates the output terminal Q2 to output a control signal. In the case where a key 821 is pressed once and the output terminal Q1 is activated to output a control signal S2, the control signal S2 is transmitted to the first resistor R1 and the second resistor R5 via the transistor 42 connected to the output terminal Q1, thereby outputting a control voltage V1 to the driver unit 61 of the lighting device 6. Afterwards, the primary side 613 of the switching power supply 612 receives the control voltage V1, and a predetermined level of power is output from the secondary side 614 to drive the light emitting diode 62 to emit light. The driver unit 61 is adapted to supply a variety of power levels with different control voltages. Different power levels may drive the light emitting diode 62 to emit light with different brightness.

For example, pressing a key 821 once may place the lighting device 6 to be at its maximum brightness state. Alternatively, successively pressing the key 821 twice may cause the lighting device 6 to emit light with maximum brightness and then decrease the brightness by 20%. Still alternatively, successively pressing the key 821 three times will at first turn on the lighting device 6 with maximum brightness, followed by decreasing the brightness by 20%, and then further decreases the brightness by 20%. By using the driver circuit disclosed herein, a broad variety of remote control units may be used to control the operation of the lighting device 6 (including the operation states of ON and OFF, brightness, and color temperature, etc.) without pairing the remote control units with the receiver module 2, and no decoding or demodulation processing is required. A user may simply press any key on a remote control unit to dim the brightness of light emitted from the lighting device 6.

It is apparent to those having ordinary skill in the art that the remote control unit 82 is described in the embodiments above for illustration purposes only and may be alternatively configured in the form of a smart phone or a tablet computer, and that the driver circuit disclosed herein may be controlled wirelessly, thereby adjusting the operation state of a lighting device (including the operation states of ON and OFF, brightness, and color temperature, etc.), regulating the operational state of a motor (such as changing its rpm) or controlling the operation state of other voltage-driven electrical devices.

The invention may be applied to control an electrical device in a wired or wireless manner Neither the pairing between the transmitter end and the receiver end, nor the incorporation of any demodulation circuit, is required in the invention. Further, by virtue of the counting function of the counter unit, pressing any key on the remote controller will cause the counter unit to output a control signal that shifts the operation of the electrical device from one operation state to another.

The present invention provides a feasible driver circuit. The technical content and technical features of the invention have been disclosed above. However, those skilled in the art may still make various substitutions and modifications without departing from the spirit of the invention based on the disclosure provided herein. Therefore, the scope of protection of the invention should not be limited to those disclosed in the embodiments, and should include various substitutions and modifications without departing from the invention, and is covered by the following patent applications.

We claim:

1. A driver circuit comprising:
a counter unit having an input terminal and a plurality of output terminals, wherein the counter unit is adapted to receive a driving signal via the input terminal and sequentially activate the output terminals following a predetermined counting sequence, thereby outputting a control signal;
a plurality of diodes, each connected directly to a respective one of the output terminals of the counter unit; and
a voltage regulation unit comprising a plurality of first resistors connected in parallel with each other and wherein each first resistor is connected to a respective one of the diodes, respectively, and a second resistor directly connected at one end in series with the first resistors and grounded at an opposite end, so that a control voltage for driving an electrical device is output from the first resistors connected to the activated output terminal and the second resistor according to the control signal,
wherein the first resistors are fixed resistors and the second resistor is a fixed resistor.

2. The driver circuit according to claim 1, further comprising a receiver unit adapted to receive a wireless initiation signal and a low-pass filter filtering the wireless initiation signal so as to generate the driving signal which is then transmitted to the counter unit.

3. The driver circuit according to claim 1, further comprising a receiver unit adapted to receive an initiation signal through a wired connection.

4. The driver circuit according to claim 3, wherein the receiver unit comprises a voltage divider circuit.

5. The driver circuit according to claim 4, wherein the receiver unit comprises at least two third resistors connected in series, and the low-pass filter is connected at a voltage dividing point between the third resistors.

6. The driver circuit according to claim 1, wherein the counter unit is selected from the group consisting of a ring counter and a Johnson counter.

7. A driver circuit comprising:
a counter unit having an input terminal and a plurality of output terminals, wherein the counter unit is adapted to receive a driving signal via the input terminal and sequentially activate the output terminals following a predetermined counting sequence, thereby outputting a control signal;
a plurality of transistors, each connected directly to a respective one of the output terminals of the counter unit; and
a voltage regulation unit comprising a plurality of first resistors connected in parallel with each other and wherein each first resistor is connected to a respective one of the transistors, respectively, and a second resistor directly connected at one end in series with the first resistors and grounded at an opposite end, so that a control voltage for driving an electrical device is output from the first resistors connected to the activated output terminal and the second resistor according to the control signal,
wherein the first resistors are fixed resistors and the second resistor is a fixed resistor.

8. The driver circuit according to claim 7, wherein each of the transistors has a drain terminal connected to the respective one of the output terminals of the counter unit, a gate terminal short-circuit connected to the drain terminal, and a source terminal connected to the respective one of the first resistors.

9. The driver circuit according to claim 7, wherein each of the transistors has a gate terminal connected to the respective one of the output terminals of the counter unit, a source terminal connected to the respective one of the first resistors, and a drain terminal connected to a power supply.

10. The driver circuit according to claim 7, further comprising a receiver unit adapted to receive a wireless initiation signal and a low-pass filter filtering the wireless initiation signal so as to generate the driving signal which is then transmitted to the counter unit.

11. The driver circuit according to claim 7, further comprising a receiver unit adapted to receive an initiation signal through a wired connection.

12. The driver circuit according to claim 11, wherein the receiver unit comprises a voltage divider circuit.

13. The driver circuit according to claim 12, wherein the receiver unit comprises at least two third resistors connected in series, and the low-pass filter is connected at a voltage dividing point between the third resistors.

14. The driver circuit according to claim 11, wherein the counter unit is selected from the group consisting of a ring counter and a Johnson counter.

* * * * *